(12) United States Patent
Deng et al.

(10) Patent No.: US 11,522,416 B2
(45) Date of Patent: Dec. 6, 2022

(54) ELECTRIC DRIVE SYSTEM

(71) Applicant: Robert Bosch GmbH, Stuttgart (DE)

(72) Inventors: Shi Deng, Shanghai (CN); Tao Zhu, Shanghai (CN); Peter Ropertz, Shanghai (CN); Heinz-Bernd Haiser, Shanghai (CN); Takashi Shigematsu, Shanghai (CN); Yanlin Li, Shanghai (CN)

(73) Assignee: Robert Bosch GmbH, Stuttgart (DE)

( * ) Notice: Subject to any disclaimer, the term of this patent is extended or adjusted under 35 U.S.C. 154(b) by 374 days.

(21) Appl. No.: 16/647,564

(22) PCT Filed: Sep. 18, 2017

(86) PCT No.: PCT/CN2017/102039
§ 371 (c)(1),
(2) Date: Mar. 16, 2020

(87) PCT Pub. No.: WO2019/051824
PCT Pub. Date: Mar. 21, 2019

(65) Prior Publication Data
US 2020/0280246 A1    Sep. 3, 2020

(51) Int. Cl.
*B60K 6/26* (2007.10)
*B60K 6/405* (2007.10)
(Continued)

(52) U.S. Cl.
CPC ............... *H02K 11/33* (2016.01); *B60K 6/26* (2013.01); *B60K 6/405* (2013.01); *H02K 7/10* (2013.01);
(Continued)

(58) Field of Classification Search
CPC ...... H02K 11/33; H02K 7/10; H02K 7/20927; B60K 6/26; B60K 6/405; B60K 2001/006;
(Continued)

(56) References Cited

U.S. PATENT DOCUMENTS

| 9,283,837 B1 * | 3/2016 | Rawlinson ............... B60K 8/00 |
| 2014/0288739 A1 | 9/2014 | Braun et al. |
| 2015/0224884 A1 * | 8/2015 | Rawlinson ............. H02K 11/33 |
| | | 903/906 |

FOREIGN PATENT DOCUMENTS

| CN | 104070980 | 10/2014 |
| CN | 204451974 | 7/2015 |

(Continued)

OTHER PUBLICATIONS

International Search Report for Application No. PCT/CN2017/102039 dated Jun. 19, 2018 (2 pages).

*Primary Examiner* — Tisha D Lewis
(74) *Attorney, Agent, or Firm* — Michael Best & Friedrich LLP

(57) ABSTRACT

An electric drive system (100) used in an electric vehicle or a hybrid electric vehicle to drive the vehicle's wheels to rotate. The electric drive system (100) includes an electric motor (300). The electric motor (300) includes a housing in which a stator and a rotor are received. A transmission device (400) is operatively coupled to the electric motor (300); and an output shaft (500) is operatively coupled to the transmission device (400). The output shaft (500) extends from the transmission device (400) and is substantially parallel to the rotor's axis of the electric motor (300). The electric drive system (100) also includes an inverter (200) secured over the housing of the electric motor (300) such that (Continued)

that the inverter is located between the output shaft (500) and the housing of the electric motor (300).

22 Claims, 6 Drawing Sheets

(51) Int. Cl.
*H02K 7/10* (2006.01)
*H02K 11/33* (2016.01)
*H05K 7/20* (2006.01)
*B60K 1/00* (2006.01)

(52) U.S. Cl.
CPC .... *H05K 7/20927* (2013.01); *B60K 2001/006* (2013.01); *B60Y 2200/91* (2013.01); *B60Y 2200/92* (2013.01); *B60Y 2400/60* (2013.01)

(58) Field of Classification Search
CPC ............ B60Y 2200/91; B60Y 2200/92; B60Y 2400/60
See application file for complete search history.

(56) References Cited

FOREIGN PATENT DOCUMENTS

| CN | 105216598 | | 1/2016 | |
|----|-----------|---|--------|---|
| JP | 2016220385 | A * | 12/2016 | ............... H02K 5/22 |
| JP | 2016220385 | A | 12/2016 | |
| WO | 9828833 | A2 | 7/1998 | |
| WO | 03056687 | | 7/2003 | |
| WO | 2013069774 | | 5/2013 | |
| WO | 2017058664 | | 4/2017 | |

* cited by examiner

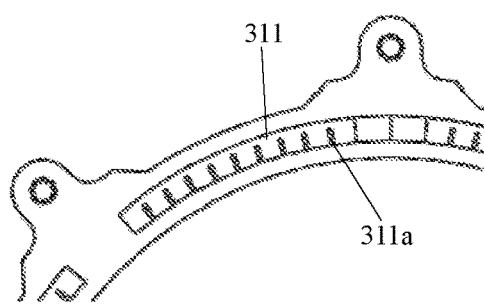
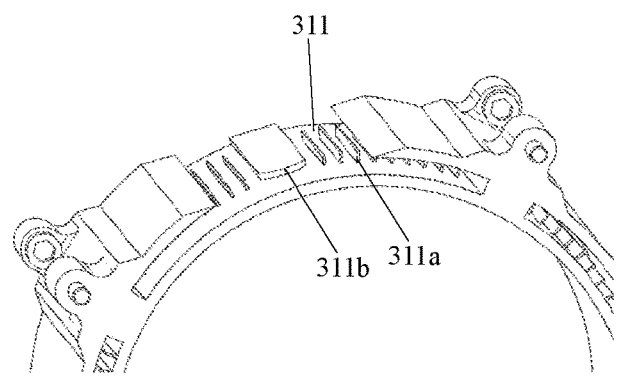
Fig. 3a     Fig. 3b

ELECTRIC DRIVE SYSTEM

BACKGROUND OF THE INVENTION

The present application generally relates to an electric drive system which is compactly integrated with an electric motor, an inverter and a transmission device.

At present, for the sake of environmental conservation, electric vehicles or hybrid electric vehicles have been widely and widely developed and used. An electric motor is used in the electric vehicle as a power supply unit. The electric motor is coupled to an inverter by which direct current from a power battery is converted into three-phase alternating current to drive the electric motor. An output shaft of the electric motor is usually coupled to a transmission device. The output shaft's rotating speed is lowered by the transmission device such that the electric vehicle's wheels can be driven to rotate.

In a conventional design of the electric vehicle, the electric motor, the inverter and the transmission device are independent from each other and usually have different housings. Therefore, when installed in the vehicle, they will occupy a large space. Moreover, it is possible that the electric motor and the inverter are separated from each other and are connected by an electrical cable and a bus-bar. Use of the long electrical cable and the bus-bar may not only increase assembling difficulty and affect maintenance, but also result in a possibility of failure. Therefore, a high degree integrated electric motor and inverter assembly is needed such that it will occupy a small space in the vehicle, and thus the assembling difficulty is decreased and the maintenance is facilitated.

Furthermore, a great amount of heat will produce when the electric motor and the inverter operate. Usually, a coolant flowing channel is provided in the housing of the electric motor such that the electric motor can be cooled down. However, under the influence of production process, the coolant flowing channel is usually not long and is provided non-uniformly around the housing such that the electric motor's cooling effect is affected.

SUMMARY OF THE INVENTION

It is one object of the present application to provide an electric drive system used in an electric vehicle or a hybrid electric vehicle, such that the system is compact in configuration and is high-integrated. Further, the system can be effectively cooled down when it is operating.

According to one aspect, the present application proposes an electric drive system used in an electric vehicle or a hybrid electric vehicle to drive the vehicle's wheels to rotate, the electric drive system comprising:

an electric motor, said electric motor including a housing in which a stator and a rotor are received;

a transmission device operatively coupled to the electric motor; and an output shaft operatively coupled to the transmission device, wherein the output shaft extends from the transmission device and is substantially parallel to the rotor's axis of the electric motor, and wherein the electric drive system also comprises an inverter, the inverter is secured over the housing of the electric motor such that the inverter is located between the output shaft and the housing of the electric motor.

Optionally, the housing of the electric motor is formed with a cooling passage in its wall, through which cooling passage coolant is able to flow, and wherein the housing of the electric motor comprises a main shell, and an end cover and a connecting cover which are connected to opposite ends of the main shell.

Optionally, the inverter comprises a housing in which a power element and/or an electrical device is received, and wherein the housing of the inverter is in contact with the main shell such that an interface is defined between the main shell and the housing of the inverter, and the coolant flowing through the cooling passage is able to contact the interface.

Optionally, the coolant is able to flow over the entire longitudinal length of the main shell.

Optionally, a through hole is provided in the housing of the electric motor, such that an electric wire for electrically connecting the inverter to the electric motor is able to pass through the hole.

Optionally, the main shell comprises a cylindrical wall, a plurality of separated channels are longitudinally formed in the cylindrical wall, and the cooling passage is partially defined by the channels.

Optionally, the main shell comprises a support platform, the support platform is formed with a channel through which the coolant is able to flow, and the cooling passage is partially defined by the channel of the support platform.

Optionally, the housing of the inverter is in contact with the support platform such that the interface is defined between the support platform and the housing of the inverter.

Optionally, the support platform contacts the inverter by a substantially planar face.

Optionally, the support platform is provided substantially tangent to the cylindrical wall of the main shell.

Optionally, the housing of the inverter has an opening side, and the housing of the inverter contacts the support platform via said opening side.

Optionally, the channel of the support platform is defined by a groove formed in the support platform and a cover plate covering on the groove.

Optionally, the housing of the inverter is an enclosed housing, and the channel of the support platform is defined by a groove formed in the support platform and a part of the enclosed housing covering on the groove.

Optionally, an additional electrical device is able to be arranged in a space between the support platform and the cylindrical wall of the main shell.

Optionally, the through hole is disposed in the support platform.

Optionally, before flowing through the channels in the cylindrical wall of the main shell, the coolant flows through the channel of the support platform.

Optionally, a plurality of circumferentially separated grooves are provided in a respective sidewall of the end cover and/or of the connecting cover facing the main shell, and the cooling passage is partially defined by the grooves.

Optionally, the cover plate is provided with a heat dissipating structure, for example fins, on a side facing the groove.

Optionally, a plurality of separated fins are provided in the channels of the main shell and/or in the grooves of the end cover and/or the connecting cover.

Optionally, in the channel of the support platform, each fin extends from a side of the channel far away from the housing of the electric motor towards a side of the channel adjacent to the housing of the electric motor.

Optionally, the fin extends to or not to said side adjacent to the housing of the electric motor.

Optionally, a guide feature is provided in the channels of the main shell and/or in the grooves of the end cover and/or the connecting cover such that the coolant is able to turn smooth.

According to technical solutions of the present application, the electric motor, the inverter and the transmission device can be integrated together in a more compact manner such that the space utilization in the vehicle's interior can be improved. Furthermore, because the cooling passage of the electric drive system can be used to cool both the electric motor and the inverter down, the inverter is ensured to be reliably cooled down during operation. Moreover, the segmental design of the electric motor's housing ensures that the cooling passage can be made longer in the housing of the electric motor such that the cooling effect of the assembly can be further improved. Further, the design of the fins in the cooling channels can increase the area of contact between the coolant and the housing of the electric motor, resulting in a better cooling effect.

BRIEF DESCRIPTION OF THE DRAWINGS

The preceding and other aspects of the present application will be well understood by the following description in combination with the attached drawings. It should be noted that although the drawings may be given in different ratios, they cannot be thought to affect understanding to the present application. In the drawings:

FIG. 3a is an enlarging cross-sectional view of a dotted box of FIG. 2a;

FIG. 3b is a partially enlarging perspective view relating to FIG. 2b;

DETAILED DESCRIPTION

Figure 1:
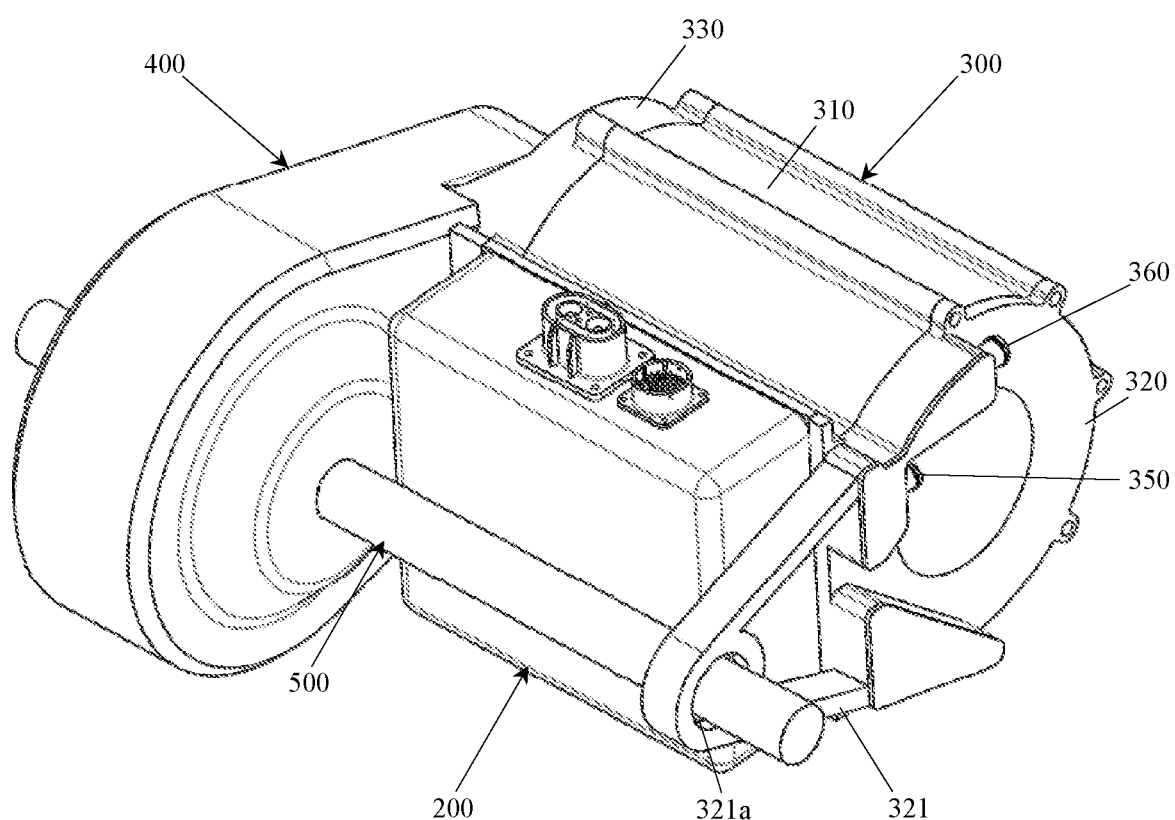
FIG. 1 is a perspective view schematically illustrating an electric drive system according to one embodiment of the present application.

In the drawings of the present application, features of the same configuration or having a similar function are represented by the same reference numerals.

FIG. 1 is a perspective view schematically illustrating an electric drive system 100 according to one embodiment of the present application. In the context of the present application, the electric drive system 100 refers to a drive system which is used in an electric vehicle to directly drive the vehicle's wheels to rotate or which is used in a hybrid electric vehicle to supplementally drive the vehicle's wheels to rotate.

According to the present application, the electric drive system 100 comprises an electric motor 300, an inverter 200, a transmission device 400 and an output shaft 500. In the embodiment illustrated by FIG. 1, the transmission device 400 can be a speed-changing gearbox or any other suitable transmission. The electric motor 300 is a three-phase electric motor, and has a housing in which a stator and a rotor (not shown) are received. The electric motor 300 has a shaft in the housing of it, which shaft is connected to the rotor. The electric motor 300 is operatively coupled to the transmission device 400 such that the electric motor shaft's output speed can be decreased via the transmission device 400.

The inverter 200 comprises a housing 210. A power element and/or other electrical devices for controlling the electric motor are received in the housing 210. The inverter 200 is used to connect to a direct current power source such as a power battery, by which inverter direct current can be converted into three-phase alternating current to drive the electric motor 300 to operate.

As shown in FIG. 1, a housing of the electric motor 300 comprises a main shell 310, and an end cover 320 and a connecting cover 330 which are connected to opposite ends of the main shell 310. Each of the main shell 310, the end cover 320 and the connecting cover 330 is formed with a coolant flowing channel therein such that after the main shell 310, the end cover 320 and the connecting cover 330 are assembled together, the respective coolant flowing channels are connected to each other to generate a cooling passage.

A housing of the transmission device 400 is in internal communication with the housing of the electric motor 300 at the connecting cover 330, such that an internal power input component of the transmission device 400 is operatively coupled to the shaft of the electric motor 300. The output shaft 500 of the electric drive system 100 is operatively coupled to an internal power output component of the transmission device 400, and thus the output shaft 500 extends outwardly from the housing of the transmission device 400. Furthermore, the output shaft 500 is substantially parallel to the shaft of the electric motor 300. That is, the output shaft 500 is substantially parallel to the rotor's axis of the electric motor 300.

As shown in FIG. 1, a support feature 321 is formed on the connecting cover 330. A support hole 321a is formed in this support feature 321. A bearing (not shown) can be mounted in the support hole 321a such that the output shaft 500 extending outwardly from the transmission device 400 is supportable via the bearing.

A given space is left between the output shaft 500 and the main shell 310 of the electric motor 300. Usually, this space is idle. However, according to the present application, in order to decrease the space occupation of the electric drive system 100, the inverter 200 is arranged between the output shaft 500 and the electric motor 300.

Figure 2A:
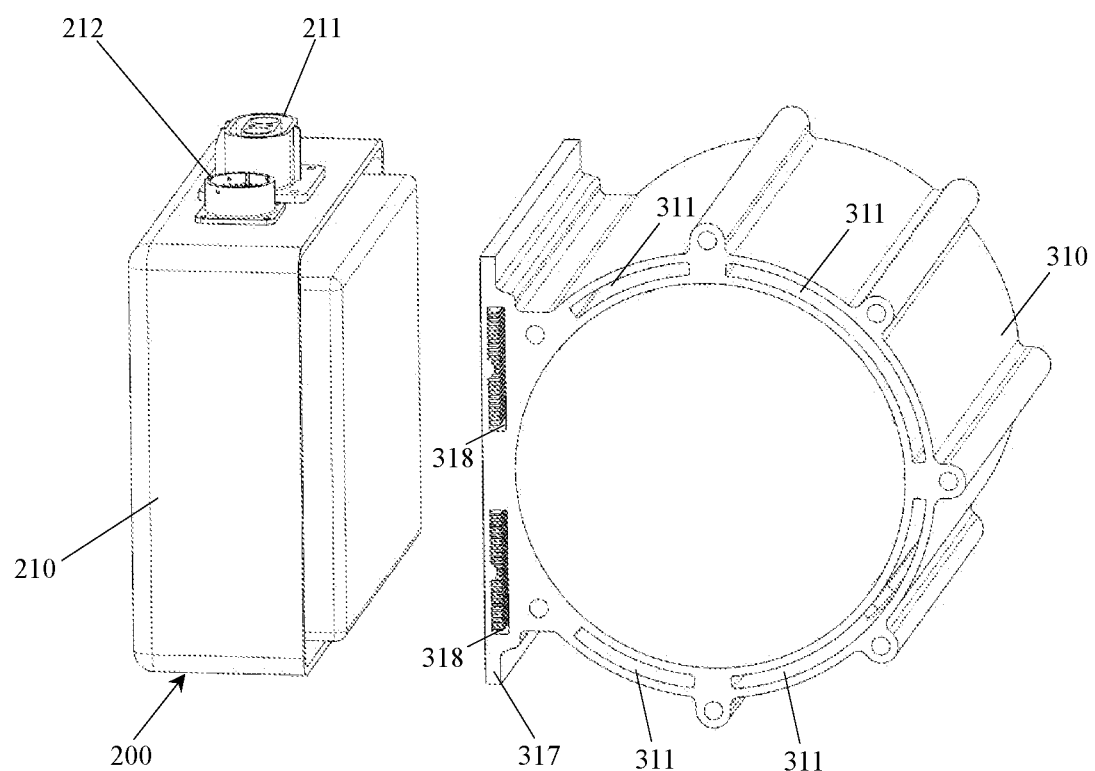
FIG. 2a is a perspective view schematically illustrating an inverter and a housing part of an electric motor according to one embodiment of the present application.
Figure 2B:
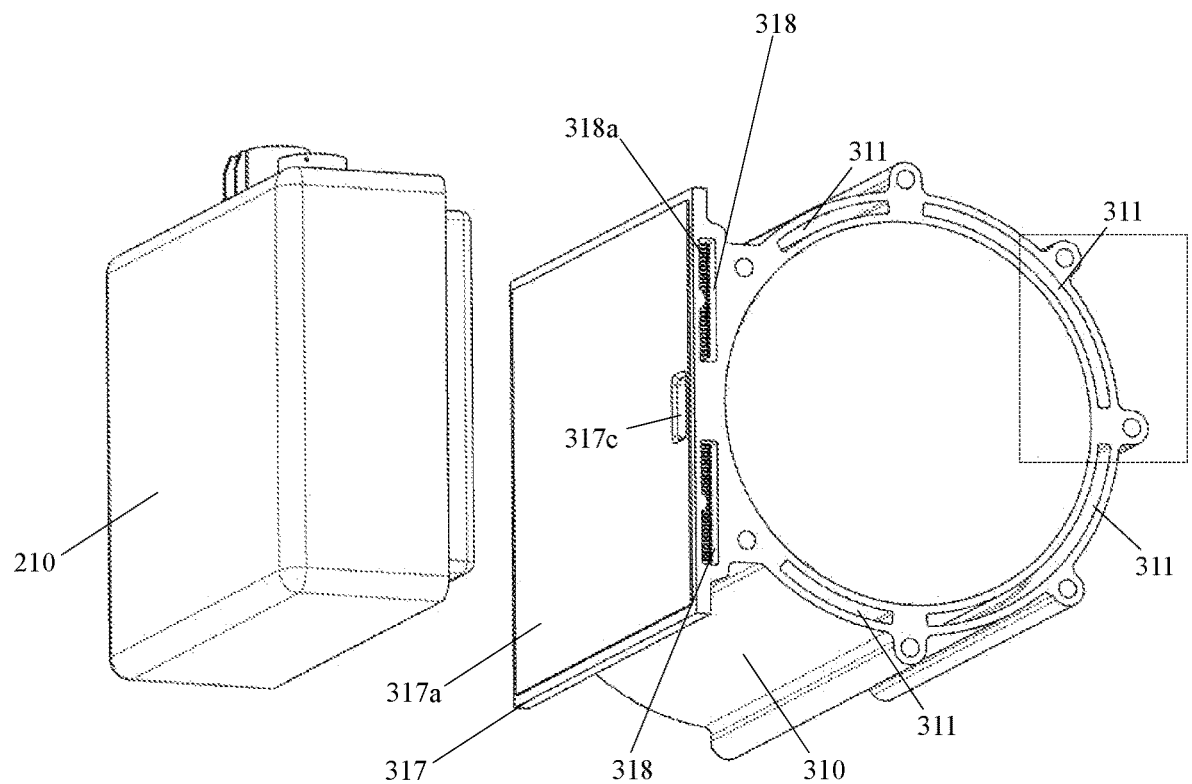
FIG. 2b is a perspective view schematically illustrating the inverter and the housing part of the electric motor of FIG. 2a but observed in another direction.

FIGS. 2a and 2b are perspective views schematically illustrating one embodiment of the housing 210 of the inverter 200 and the main shell 310 of the electric motor 300 according to the present application. The housing 210 is generally cubical and has an opening at one side. A power adapter 211 and a signal adapter 212 are provided in the housing 210. The power adapter 211 is used to connect to the direct current power source such as the power battery such that the electric motor 300 is energized via the inverter 200. The signal adapter 212 is connectable to a central control unit of the vehicle so as to control the inverter 200 and/or the electric motor 300.

The main shell 310 is substantially hollow cylinder-shaped. A support platform 317 is integrally formed in an outer side of the main shell 310. Furthermore, a plurality of separated channels 311 are longitudinally formed in a cylindrical wall of the main shell 310. Four channels 311 are illustrated by FIGS. 2a and 2b. A part of the coolant flowing channel of the main shell 310 is defined by the channels 311. A plurality of separated channels 318 are also longitudinally formed in the support platform 317. Two channels 318 are illustrated by FIGS. 2a and 2b. In one optional embodiment, the two channels 318 can be in direct fluid communication with each other. The other part of the coolant flowing channel of the main shell 310 is defined by the channels 318. The channels 311 and 318 are disposed in the main shell 310 such that the coolant can flow over the entire longitudinal length of the main shell 310.

A plurality of circumferentially separated grooves are formed in respective sidewalls of the end cover 320 and the connecting cover 330 facing the main shell 310. Those grooves define the coolant flowing channels of the end cover 320 and the connecting cover 330 respectively. When the end cover 320 and the connecting cover 330 are connected to the main shell 310 via bolts or any other suitable mechanical means, the channels 311 and 318 are connected to the grooves so as to generate the cooling passage of the electric motor 300. An inlet 350 and an outlet 360 for the coolant are provided in the end cover 320. The inlet 350 and the outlet 360 are in fluid communication with the cooling passage of the electric motor 300. The channels 311 and 318, the inlet 350 and the outlet 360 can be designed such that the coolant, after entering the inlet 350, first flows through the channels 318 and then through the channels 311, and finally discharges out of the outlet 360.

The support platform 317 has a substantially planar sidewall 317a. This sidewall is also a sidewall of the channels 318. When assembling, the power element and/or the electric devices are first mounted in the housing 210 having the opening at the side. Then, the housing 210 of the inverter 200 is securely mounted over the support platform 317 via bolts or any other suitable mechanical means, such that the opening side of the housing 210 is in contact with the sidewall 317a of the support platform 317. In this way, the power elements and/or the electric devices in the housing 210 can directly face and/or contact the sidewall 317a. This sidewall 317a of the support platform 317 defines an interface between the housing 210 and the main shell 310. Because heat emitting from the power elements and/or the electric devices in the housing 210 will transfer to the interface, the coolant, flowing through the channels 318 of the support platform 317 and thus contacting the interface, can take away the heat such that the inverter 200 can be cooled down.

As shown in FIG. 2b, a through hole 317c is provided in the support platform 317. For example, the through hole 317c can be located between the two channels 318. This through hole 317c opens into the hollow interior of the main shell 310, such that when the housing 210 of the inverter 200 is mounted over the support platform 317, electric wires connecting the power element and/or the electrical devices of the inverter 200 to electrical components of the electric motor 300 can pass through the through hole 317c and thus are inbuilt in the electric drive system 100. It should be understood by an ordinary person in the art that the through hole 317c can be alternatively provided at any other suitable location in the housing of the electric motor 300.

In order to increase the area of contact between the coolant and the main shell 310, a plurality of circumferentially separated fins 311a are provided in each of the channels 311. FIG. 3a is an enlarging cross-sectional view of the dotted box of FIG. 2b. Each fin 311a can be elongated. For instance, the fins 311a can be shorter axially than the channels 311. In each channel 311, the fins 311a extend radially and outwardly from a sidewall of the channel 311 adjacent to the housing's interior. Alternatively, the fins 311a can extend to or not to a radially opposing sidewall of the channel 311. In this way, the existence of the fins 311a does not affect the flowability of the coolant in the channel 311 and increases the area of contact between the coolant and the shell.

In order to increase the area of contact between the coolant and the support platform 317, a plurality of separated fins 318a are formed on a face of the sidewall 317c facing the channels 318. Each fin 318 can extend vertically from said face. Alternatively, the fins 318 can extend to or not to a sidewall of the channels 318 opposing said face. In this way, the existence of the fins 318a does not affect the flowability of the coolant in the channel 318 and increases the area of contact between the coolant and the sidewall 317c.

When the coolant flows to the end cover 320 and/or the connecting cover 330 along the fins 311a in one channel 311, the coolant may turn by 180 degrees under attack, which may hinder the coolant to flow and thus negatively affect the cooling effect. In order to avoid such a hindering effect caused by sharp turning, an optional embodiment of the present application is illustrated by FIG. 3b. According to this optional embodiment, a guide feature 311b is provided in the channel 311 of the main shell 310 at a position adjacent to the end cover 320 and/or the connecting cover 330. For example, the guide feature 311b is substantially at a circumferential middle position in the channel 311 and is spaced from the adjacent fins 311a. The guide feature 311b has two rounded corners at both sides respectively. In this way, when the coolant flowing along the adjacent fins 311b impacts the end cover 320 and/or the connecting cover 330, the coolant, under the influence of the rounded corners of the guide feature 311b, will not turn sharply but turn smooth a little along the rounded corners of the guide feature 311b. Therefore, the velocity of flow of the coolant will not be decreased greatly such that the cooling effect of the electric motor 300 will not be greatly affected.

As explained already, the housing of the electric motor 300 is produced in a segmental manner and assembled. Therefore, the main shell 310 can be produced by extruding. Comparison with a housing of the electric motor 300 conventionally produced by casting, the cooling passage in the housing of the electric motor 300 according to the present application can be made longer. That is to say, more coolant per unit time can flow in the housing wall of the electric motor 300, resulting in a better cooling effect. Furthermore, according to the present application, the coolant can flow substantially over the entire longitudinal length of the housing of the electric motor 300 such that the cooling effect of the electric motor 300 is greatly strengthened.

Figure 4:
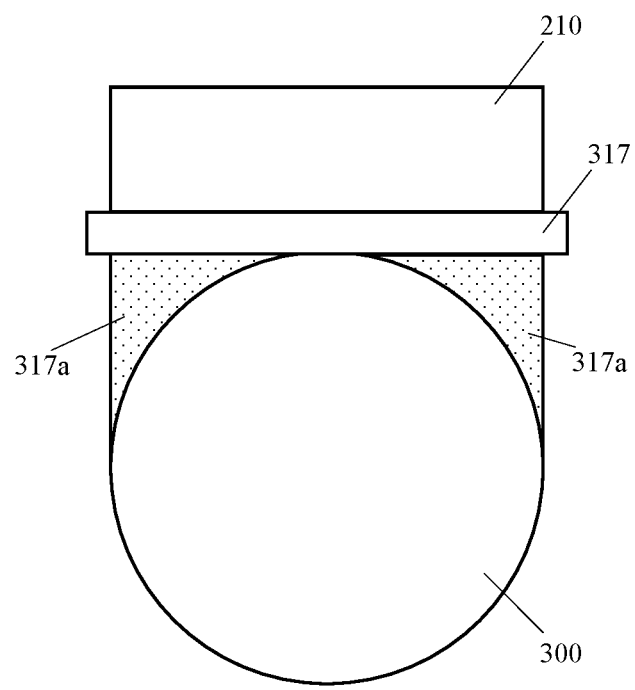
FIG. 4 is an axial view schematically illustrating the housing part of the electric motor and the inverter.

FIG. 4 is an axial view schematically illustrating the housing of the electric motor 300 and the inverter 200. In the embodiment of the present application, the support platform 317 is provided such that it is substantially tangent to the cylindrical wall of the main shell 310. It can be seen that there exists a space 317b (as illustrated by shading) between the support platform 317 and the cylindrical wall of the main shell 310. For the sake of compact arrangement, other electrical devices of the electric drive system 100 can be disposed in the space 317b.

Figure 5A:
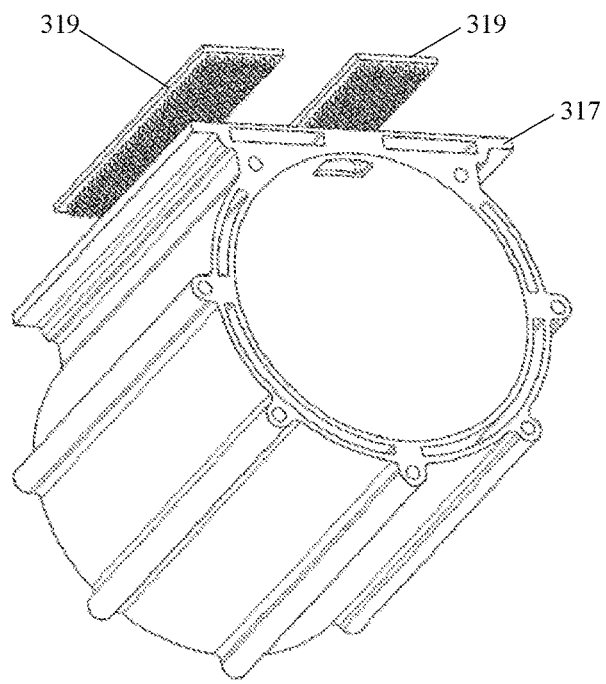
FIGS. 5a and 5b are perspective views schematically illustrating another embodiment of the housing part of the electric motor according to the present application.
Figure 5B:
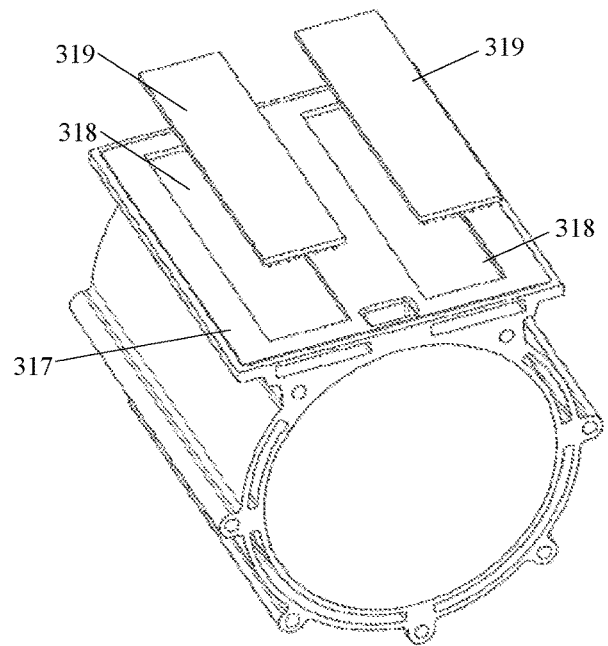

FIGS. 5a and 5b are perspective views schematically illustrating another embodiment of the main shell 310 of the electric motor 300 according to the present application. Similar to FIGS. 2a and 2b, the main shell 310 according to this embodiment is substantially hollow cylinder-shaped. A support platform 317 is integrally formed in an outer side of the main shell 310. A plurality of separated channels 311 are longitudinally formed in a cylindrical wall of the main shell 310. A plurality of separated channels 318, for example two channels 318 are also longitudinally formed in the support platform 317. According to this embodiment, each channel 318 is defined by a groove formed in the support platform 317 and a cover plate 319 covering on the groove. Using such a forming manner, the manufacturing difficulty of the main shell 310 can be further lowered. The cover plate 319 is substantially planar, and is provided with a heat dissipating structure on a side facing the groove of the support platform 317, so as to increase the area of contact between the coolant and it. For example, the heat dissipating structure can comprise a plurality of separated fins or is a netlike structure. In this embodiment, when the inverter 200 is mounted on the main shell 310 in place, the side of the cover plate 319 facing the groove of the support platform 317 defines the interface between the housing 210 and the main shell 310. Because the heat emitting from the power elements and/or the electric devices in the housing 210 will transfer to the interface, the coolant, flowing through the channels 318 of the support platform 317 and thus contacting the interface, can take away the heat such that the inverter 200 can be cooled down.

It should be understood by the ordinary person in the art that in order to ensure sealing, a leak-proof structure such as a gasket can be clamped between the main shell 310 and the inverter 200 and/or between the cover plate 319 and the support platform 317.

In the embodiments of the present application, the fins 311a and/or the guide feature 311b can be integrally formed in the main shell 310 or alternatively can be soldered or otherwise connected to the main shell 310 as independent element(s). Similarly, the fins 318a can be integrally formed in the sidewall 317c or alternatively can be soldered or otherwise connected to the sidewall 317c as independent elements. It should be understood by the ordinary person in the art that similar fins can be applied in the grooves 321 of the end cover 320 and/or the grooves of the connecting cover 330 defining the coolant flowing channel, such that the area of contact between the coolant and them can be increased to improve the cooling effect.

In the embodiment illustrated by FIGS. 2a and 2b, the housing 210 of the inverter 200 is an open housing. In an alternative embodiment, the housing 210 of the inverter 200 can be an enclosed housing in which the power element and the relevant electrical devices are received. Therefore, as concerns the main shell 310 illustrated by FIGS. 5a and 5b, no cover plate 319 will be needed. Rather, the housing 210 of the inverter 200 will be directly mounted to the support platform 317. That is to say, the channel 318 will be defined by the groove of the support platform 317 and a side of the housing 210 contacting the support platform 317 together. In this case, the side of the housing 210 in contact with the support platform 317 defines the interface between the housing 210 and the main shell 310. Because the heat emitting from the power elements and/or the electric devices in the housing 210 will transfer to the interface, the coolant, flowing through the channels 318 of the support platform 317 and thus contacting the interface, can take away the heat such that the inverter 200 can be cooled down. In order to strengthen the cooling effect, said side of the housing 210 in contact with the support platform 317 can be provided with a plurality of fins or a suitable heat dissipating structure.

Although in the already mentioned embodiments the support platform 317 is generally planar, it can be alternatively formed such that it is slightly curved. In this case, the housing 210 of the inverter 200 should be shaped complementary to the support platform 317 such that the housing 210 is ensured to be mounted over the support platform 317.

Although some specific embodiments of the present application have been described here, they are given for illustrative purpose only and cannot be deemed to constrain the scope of the present application. Various replacements, alternations and modifications can be thought out without departing from the spirit and scope of the present application.

What is claimed is:

1. An electric drive system (100) used in an electric vehicle or a hybrid electric vehicle to drive the vehicle's wheels to rotate, the electric drive system (100) comprising:
an electric motor (300), said electric motor including a housing in which a stator and a rotor are received, the rotor having a rotor axis, and wherein the housing includes a main shell (310) with a connecting cover (330) and an end cover (320) arranged at opposite ends of the main shell (310);
a support feature (321) that extends from the end cover (320) and includes a support hole (321a);
a transmission device (400) operatively coupled to the electric motor (300) the transmission device (400) being arranged on the connecting cover (330);
an output shaft (500) operatively coupled to the transmission device (400), wherein the output shaft (500) extends from the transmission device (400) and is substantially parallel to the rotor axis, and wherein the output shaft (500) extends from the transmission device (400) and through the support hole (321a), and
an inverter (200), the inverter (200) being secured over the housing of the electric motor (300) such that the inverter (200) is enclosed in a space defined by and inside the main shell (310), the transmission device (400), the output shaft (500), and the support feature (321).

2. The electric drive system (100) as claimed in claim 1, wherein the housing of the electric motor (300) is formed with a cooling passage in a wall of the housing, through which cooling passage coolant is able to flow.

3. The electric drive system (100) as claimed in claim 2, wherein the inverter (200) comprises a housing (210) in which a power element and/or an electrical device is received, and wherein the housing (210) of the inverter (200) is in contact with the main shell (310) such that an interface is defined between the main shell (310) and the housing (210) of the inverter (200), and the coolant flowing through the cooling passage is able to contact the interface.

4. The electric drive system (100) as claimed in claim 2, wherein the electric drive system is configured such that the coolant is able to flow over the entire longitudinal length of the main shell (310).

5. The electric drive system (100) as claimed in claim 2, wherein a through hole (317c) is provided in the housing of the electric motor (300), such that an electric wire for electrically connecting the inverter (200) to the electric motor (300) is able to pass through the hole.

6. The electric drive system (100) as claimed in claim 2, wherein the main shell (310) comprises a cylindrical wall, a plurality of separated channels (311) are longitudinally formed in the cylindrical wall, and the cooling passage is partially defined by the channels (311).

7. The electric drive system (100) as claimed in claim 5, wherein the main shell (310) comprises a support platform (317), the support platform (317) is formed with a channel (318) through which the coolant is able to flow, and the cooling passage is partially defined by the channel (318) of the support platform (317).

8. The electric drive system (100) as claimed in claim 7, wherein the housing (210) of the inverter (200) is in contact with the support platform (317) such that an interface is defined between the support platform (317) and the housing (210) of the inverter (200).

9. The electric drive system (100) as claimed in claim 8, wherein the support platform (317) contacts the inverter (200) by a substantially planar face.

10. The electric drive system (100) as claimed in claim 7, wherein the support platform (317) is provided substantially tangent to the cylindrical wall of the main shell (310).

11. The electric drive system (100) as claimed in claim 7, wherein the housing (210) of the inverter (200) has an opening side, and the housing (210) of the inverter (200) contacts the support platform (317) via said opening side.

12. The electric drive system (100) as claimed in claim 11, wherein the channel (318) of the support platform (317) is defined by a groove formed in the support platform (317) and a cover plate (319) covering on the groove.

13. The electric drive system (100) as claimed in claim 7, wherein the housing (210) of the inverter (200) is an enclosed housing, and the channel (318) of the support platform (317) is defined by a groove formed in the support platform (317) and a part of the enclosed housing covering the groove.

14. The electric drive system (100) as claimed in claim 7, wherein the electric drive system is configured such that an additional electrical device is able to be arranged in a space between the support platform (317) and the cylindrical wall of the main shell (310).

15. The electric drive system (100) as claimed in claim 7, wherein the through hole (317*c*) is disposed in the support platform (317).

16. The electric drive system (100) as claimed in claim 7, wherein the electric drive system is configured such that before flowing through the channels (311) in the cylindrical wall of the main shell (310), the coolant flows through the channel (318) of the support platform (317).

17. The electric drive system (100) as claimed in claim 6, wherein a plurality of circumferentially separated grooves are provided in a respective sidewall of the end cover (320) and/or of the connecting cover (330) facing the main shell (310), and the cooling passage is partially defined by the grooves.

18. The electric drive system (100) as claimed in claim 12, wherein the cover plate (319) is provided with a heat dissipating structure on a side facing the groove.

19. The electric drive system (100) as claimed in claim 17, wherein a plurality of separated fins are provided in the channels (311 and/or 318) of the main shell (310) and/or in the grooves of the end cover (320) and/or the connecting cover (330).

20. The electric drive system (100) as claimed in claim 19, wherein in the channel (318) of the support platform (317), each fin extends from a side of the channel (318) far away from the housing of the electric motor (300) towards a side of the channel (318) adjacent to the housing of the electric motor (300).

21. The electric drive system (100) as claimed in claim 17, wherein a guide feature is provided in the channels (311 and/or 318) of the main shell (310) and/or in the grooves of the end cover (320) and/or the connecting cover (330) such that the coolant is able to turn smooth.

22. The electric drive system (100) as claimed in claim 1, wherein the inverter (200) is between the main shell (310) and the output shaft (500), and wherein the inverter (200) is between the transmission device (400) and the support feature (321).

* * * * *